United States Patent [19]
Satoh et al.

[11] Patent Number: 5,519,398
[45] Date of Patent: May 21, 1996

[54] SIGNAL PROCESSING APPARATUS HAVING A/D CONVERSION FUNCTION

[75] Inventors: Naoki Satoh, Kokubunji, Japan; Hirotsugu Kojima, Foster City, Calif.; Hideki Sawaguchi, Kodaira; Masao Hotta, Hanno, both of Japan

[73] Assignee: Hitachi, Ltd., Tokyo, Japan

[21] Appl. No.: 135,478

[22] Filed: Oct. 13, 1993

[30] Foreign Application Priority Data

Oct. 13, 1992 [JP] Japan ................................. 4-274039

[51] Int. Cl.$^6$ ................................................... H03M 1/36
[52] U.S. Cl. ............................................................. 341/159
[58] Field of Search ................................. 341/159, 106, 341/155, 158, 156

[56] References Cited

U.S. PATENT DOCUMENTS

| 4,884,075 | 11/1989 | Mangelsdorf | 341/159 |
| 5,223,834 | 6/1993 | Wang et al. | 341/136 |

Primary Examiner—Brian K. Young
Attorney, Agent, or Firm—Antonelli, Terry, Stout & Kraus

[57] ABSTRACT

A signal processing apparatus for converting an analog signal to a digital signal and processing the digital signal. In particular, a digital filter for performing processing at high speed is implemented by using an integrated circuit of low power consumption. The signal processing apparatus includes a circuit for comparing an input analog signal with each voltage of a plurality of analog reference voltages and generating a thermometer code Tc depending upon the analog input signal, a decoder for detecting a change point of the thermometer code Tc, and a plurality of memory circuits having output signal lines of the decoder as word selection lines. The product of an input signal value corresponding to each word selection line and a predetermined filter coefficient is stored in the corresponding word of the memory circuits. The memories are used as look-up tables.

19 Claims, 15 Drawing Sheets

SIGNAL PROCESSING APPARATUS HAVING A/D CONVERSION FUNCTION

BACKGROUND OF THE INVENTION

The present invention relates to a signal processing apparatus for converting analog signals to digital signals and processing the resultant digital signals, and the present invention is suitable for an integrated circuit for conducting processing at high speed. More particularly, the present invention relates to a circuit configuration in applying the above described signal processing apparatus as an adaptive equalizer, and the present invention is suitable for magnetic recording/reproducing apparatuses.

In various data collection systems for converting input analog signals to digital signals and conducting product summing operation and signal processing apparatuses for conducting digital processing on output signals of analog sensors, a combination of an A/D (Analog/Digital) converter and a signal processing circuit has heretofore been used.

Each A/D converter compares an input signal with a reference signal to obtain a binary value, converts the input signal to a binary number representation, and outputs the binary number representation. In many A/D converters, a thermometer code is generated according to the magnitude of an analog input signal and a change point thereof is detected. The signal of this detected change point is encoded, converted to a binary code, and then output.

In digital signal processing circuits, processing is conducted in various ways. In many cases, however, filtering for equalizing the input signal to a specific waveform is conducted at the beginning. Filtering is processing of multiplying the input signal by a plurality of filter coefficients, providing resultant products respectively with predetermined delays, and adding up the products thus delayed. It is known that a configuration in which a look-up table including a memory circuit is used for multiplication of filter coefficients is effective to reduce power consumption for processing in which filter coefficients do not change every moment. An example of a digital filter formed by using a look-up table is described in IEEE Proceedings of ISSCC '90, TAM 7.3. The look-up table used here stores the product of a memory address value and a predetermined coefficient at each address and outputs the product of data and a predetermined coefficient when an address associated with data has been selected.

As described before, the A/D converter first converts an analog input signal to a thermometer code. In the thermometer code, all bits as far as the bit position associated with the signal level have high levels and all bits above the bit position have low levels. Then a signal indicating the change point of this thermometer code is generated. By using the signal as an input selection signal, a binary encoder is driven to obtain a digital output. Meanwhile, in the look-up table, a digital signal of a binary number is decoded to generate a word selection signal. The word selection signal is a memory address selection signal for selecting a plurality of bits as a word.

If a signal processing circuit provided with an analog signal as its input is formed by simply connecting a conventional A/D converter as described above with a conventional look-up table as described above, then the circuit scale becomes large, and power consumption increases wastefully. It has also been found that in this case the processing speed cannot be made sufficiently high. Especially if an integrated circuit having functions of both circuits is to be formed, reduction of both the circuit scale and power consumption become an important problem.

SUMMARY OF THE INVENTION

An object of the present invention is to provide a signal processing apparatus reduced in circuit scale and power consumption as compared with the conventional technique.

Another object of the present invention is to provide a programmable filter which allows rewriting filter coefficients easily and rapidly.

Still another object of the present invention is to provide an adaptive filter or an adaptive equalizer of low power consumption.

In accordance with one aspect of the present invention, a signal processing apparatus includes a comparator group for comparing an input analog signal with a plurality of reference voltages to generate a thermometer code corresponding to the analog input signal, a circuit for detecting a change point of the thermometer code, and a plurality of memory circuits having a signal line group indicating the change point of the thermometer code as word selection lines, and look-up tables are formed by storing, in each word of the memory circuits, a product obtained by multiplying an input signal value corresponding to a word selection line by a predetermined filter coefficient.

In accordance with another aspect of the present invention, a signal processing apparatus includes a plurality of look-up tables as described above for storing results of computation of multiplying by a plurality of filter coefficients, and a selection circuit for selectively connecting a change point signal of one thermometer code to one of a plurality of word selection lines of memory circuits which store results of multiplication by different filter coefficients. By selection in the selection circuit, selection of filter coefficients, i.e., changeover of the filter characteristic of the filtering processing can be done at high speed.

In accordance with another aspect of the present invention, a plurality of memory circuits having a signal line group indicating a change point of the thermometer code as word selection lines are provided, and a value corresponding to a word selection line, i.e., a multiplication result for a filter coefficient equivalent to unity is stored in one of the memory circuits, the output of the memory circuit being used as the output of an A/D converter. Furthermore, a latch circuit having a plurality of cascade-connected latches is connected to the output of this memory circuit and used to record the change of the input analog signal. This record can be used as information for calculating filter coefficients of data of other parts of a plurality of memory circuits described above. The configuration including such filter coefficient calculation circuit may be used as an adaptive filter or an adaptive equalizer.

DESCRIPTION OF THE PREFERRED EMBODIMENTS

Figure 1:
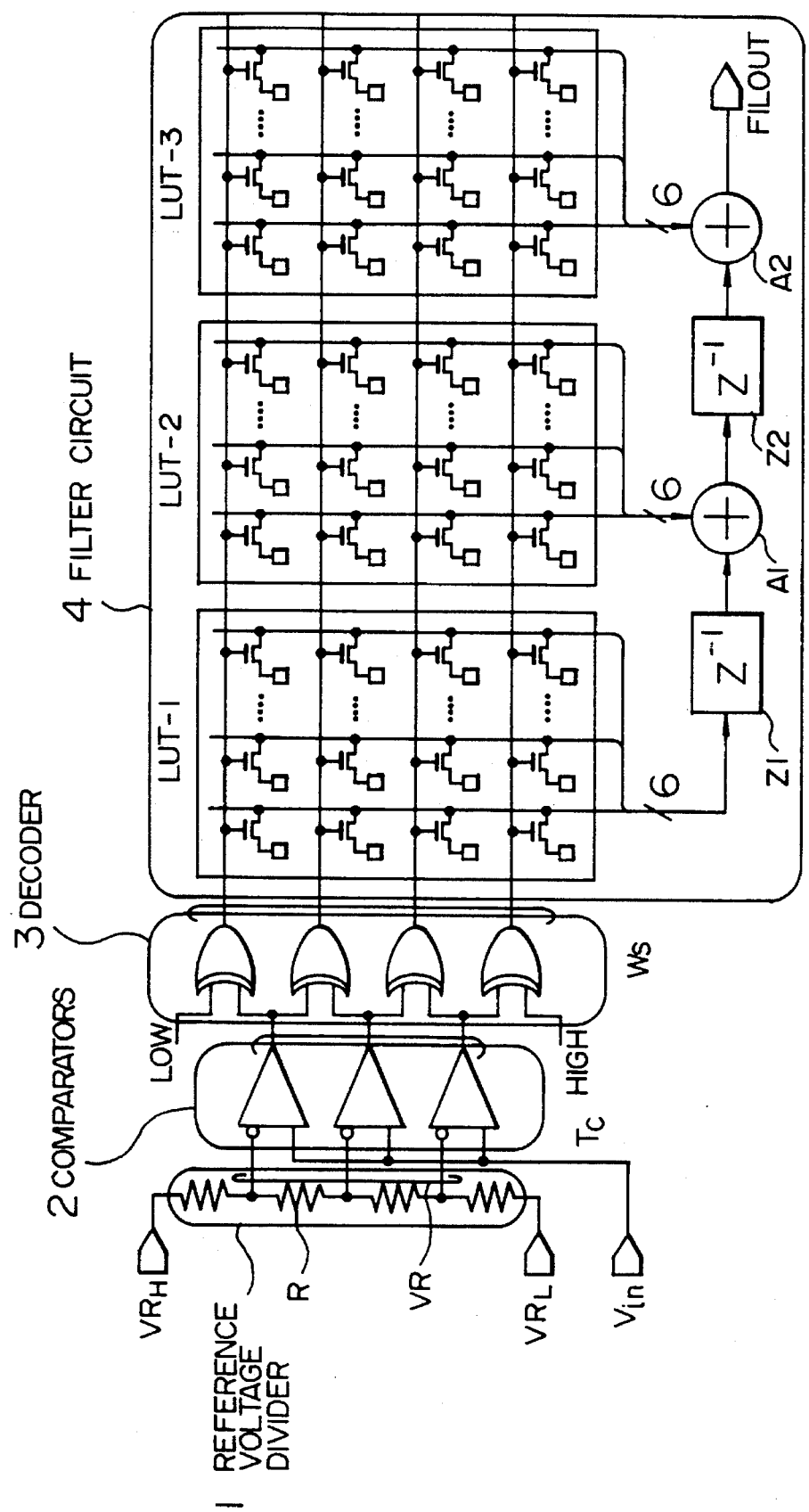
FIG. 1 is a block diagram showing a first embodiment of the present invention.

A first embodiment of the present invention is shown in FIG. 1. In FIG. 1, a three-tap digital filter circuit formed by combining a two-bit flash-type A/D converter with look-up tables is illustrated.

A reference voltage divider circuit 1 includes a resistor ladder R having four resistors. To ends of the resistor ladder R, analog reference voltages VRH and VRL are applied, respectively. As a result, a group of different divided reference voltages VR increased by a step equivalent to a quarter of the potential difference (VRH-VRL) are generated at respective taps of the resistor ladder R. A comparator group 2 compares an input analog signal Vin with each voltage of the divided reference voltage group VR. Thereby, parallel outputs of the comparator group 2 become a thermometer code Tc depending upon the analog input signal Vin. This thermometer code Tc is decoded by a decoder 3. The decoder 3 is formed by an exclusive OR gate group. Each exclusive OR gate in the exclusive OR gate group performs an exclusive OR-ing function between adjacent bits of the thermometer code Tc fed from the comparator group 2. Therefore, only one output among a plurality of outputs of the decoder 3 becomes a high level. The bit position which becomes the high level indicates a change point of the thermometer code Tc, which in turn indicates the level of the above described analog input signal Vin.

A filter circuit 4 has three look-up tables LUT-1, LUT-2 and LUT-3. Each look-up table is formed by an EPROM array. Output signals of the above described decoder 3 are connected to word selection lines Ws of the look-up tables. In each word of the look-up table LUT-1, the product of the level of the input signal Vin indicated by its word address and a coefficient $C_1$ is stored beforehand. In the same way, the product of the level of the input signal Vin indicated by its word address and a coefficient $C_0$ is stored beforehand in each word of the look-up table LUT-2. Furthermore, the product of the level of the input signal Vin indicated by its word address and a coefficient $C_{-1}$ is stored beforehand in each word of the look-up table LUT-3. Data read out from the look-up table LUT-1 is led to an adder A1 via a delay unit Z1 and added to data read out from the look-up table LUT-2. Resultant sum data is led to an adder A2 via a delay unit Z2 and added to data read out from the look-up table LUT-3 to yield a filter output FILOUT. Parallel data reading from the three look-up tables is conducted repetitively at intervals of predetermined sampling periods. Therefore, three values of the analog input signal Vin sampled at intervals of one sampling period are multiplied by coefficients $C_1$, $C_0$ and $C_{-1}$, respectively. Digital data representing the sum of resultant products are obtained as the filter output FILOUT one after another.

A feature of the circuit of the embodiment heretofore described is that both the encoder included in the A/D converter and the decoder for decoding binary digital signals included in the look-up table are omitted. Thereby, reduction of circuit scale, reduction of power consumption, and improvement of processing speed can be simultaneously achieved. The decoder 3 is a decoder for detecting a change point of the thermometer code and it is indispensable for a flash-type A/D converter. The circuit of the embodiment quantizes and filters the input signal with the precision of two bits. In general, for quantizing and filtering the input signal with the precision of n bits, $(2^n-1)$ comparators and $2^n$ exclusive OR gates forming the decoder for detecting a change point of the thermometer code are needed.

Figure 2:
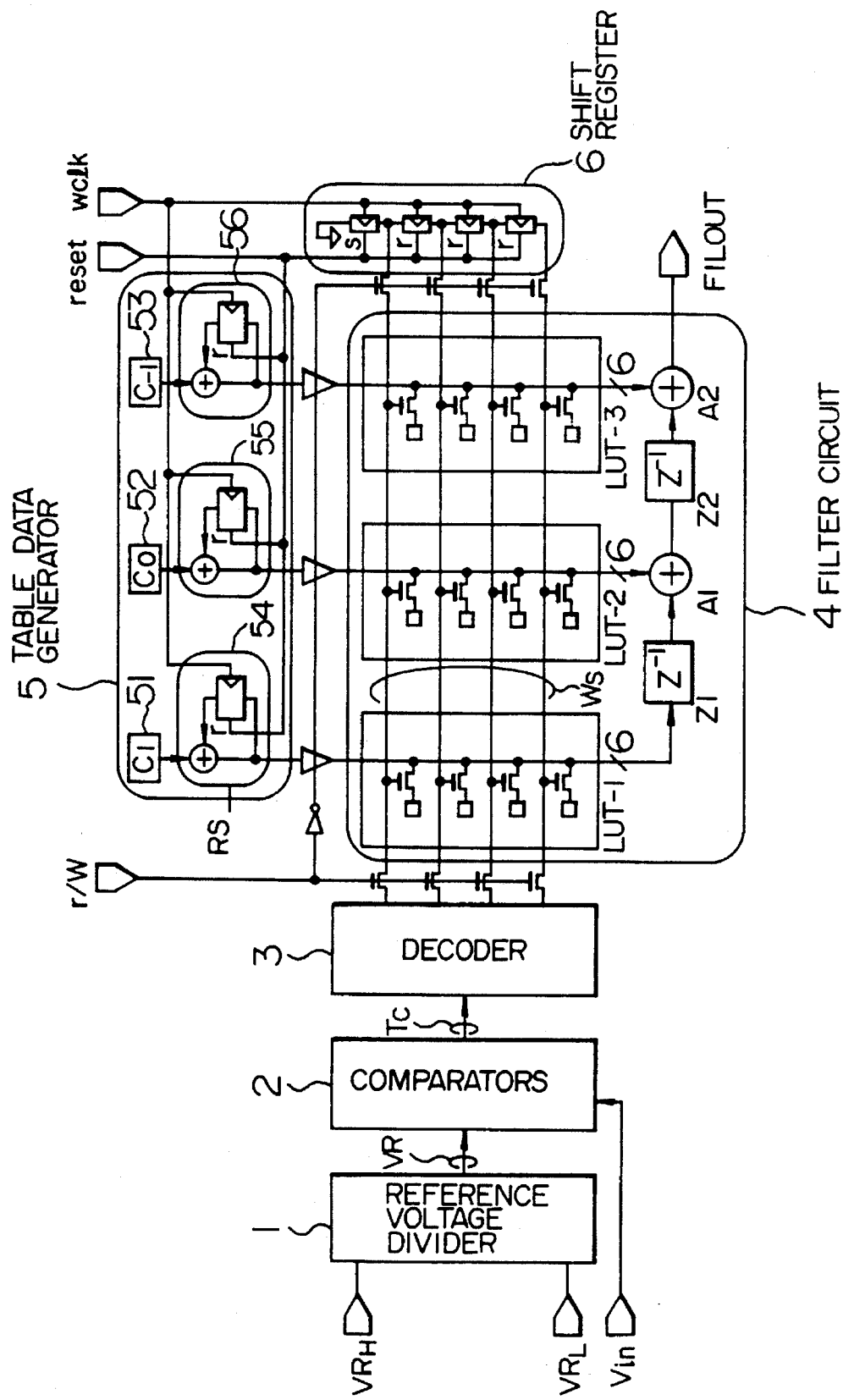
FIG. 2 is a block diagram showing a second embodiment of the present invention.

A second embodiment of the present invention is shown in FIG. 2. In the embodiment shown in FIG. 2, a circuit for updating look-up tables has been added to the first embodiment shown in FIG. 1. The same components as those of FIG. 1 are denoted by like characters. When a read/write changeover signal r/w is at a low level, the circuit of FIG. 2 is completely identical with that of FIG. 1 and the filtering operation of the input signal is performed. If the read/write changeover signal r/w is changed to a high level, word selection lines Ws of the look-up tables are selected one after another by a shift register 6. Data generated by a table data generator 5 are stored one after another in the look-up tables. The table data generator 5 includes registers 51, 52 and 53 respectively for setting three tap coefficients $C_1$, $C_0$ and $C_{-1}$ of the filter circuit 4 and accumulation registers 54, 55 and 56 for calculating write data of words, respectively, of the look-up tables LUT-1, LUT-2 and LUT-3 from these coefficients. In case the dynamic range of the input signal Vin is set around zero, the product of each coefficient and the maximum negative input value is set as the initial value of each of the accumulation registers 54, 55 and 56. In the present embodiment, the input is represented by two bits. In case the input is considered to have four kinds: 0, 1, 2 and 3, the configuration of FIG. 2 is used as it is. In case the input is a signal having substantial positive-negative symmetry as in two's complement representation, the input values are $-2$, $-1$, 0 and 1. At this time, initial values of the accumulation registers 51, 52 and 53 must be products of respective coefficients and $-2$. For calculating the initial values, it is not necessary to use multiplier circuits, but only bit shift of the coefficient values suffices. Each time a write clock wclk is input, contents of the accumulation registers 54, 55 and 56 are respectively written into the look-up tables LUT-1, LUT-2 and LUT-3 and the coefficients $C_1$, $C_0$ and $C_{-1}$ are added to contents of respective accumulation registers. By operation of the shift register 6, the write address is moved one after another from the word of the lowest order. Thereby, data update of the all look-up tables of the filter circuit 4 is performed. By such a configuration of FIG. 2, a programmable filter is obtained.

The embodiment of FIG. 2 can be further modified. For example, in case sufficient time is allowed for updating the tables, only one set of accumulation register may be provided for updating coefficients. The one set of accumulation registers is switched for each table to be updated, and used. The registers for setting the coefficients $C_1$, $C_0$ and $C_{-1}$ are required individually. In case of a three-tap digital filter circuit, data update of the all look-up tables of the filter circuit is performed while the output of the shift register is making the round three times.

Figure 3:
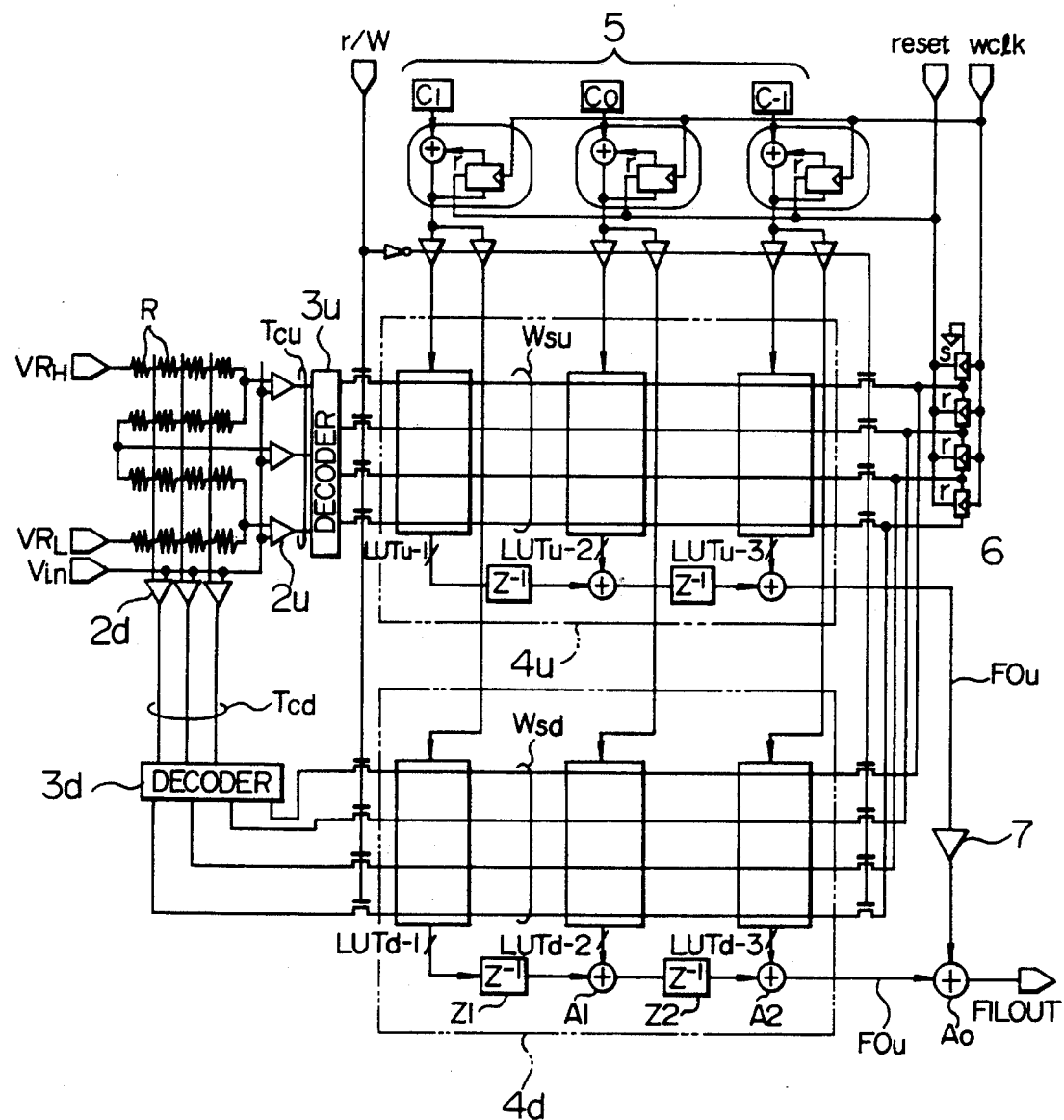
FIG. 3 is a block diagram showing a third embodiment of the present invention.

A third embodiment of the present invention is shown in FIG. 3. In FIG. 3, a three-tap digital filter circuit formed by combining a four-bit two-step parallel A/D converter with look-up tables is illustrated. The four-bit two-step parallel A/D converter has a comparator group for obtaining a conversion output of two upper bits and a comparator group for obtaining a conversion output of two lower bits. By the position of the change point of the thermometer code obtained by the former comparator group, levels of the reference voltage group supplied to the latter comparator group are selected. Thereby, the latter comparator group discriminates the level corresponding to the quantization error of the digital output obtained from the output of the former comparator group. The two-step parallel A/D converter itself is described in U.S. Pat. No. 4,875,048.

In the circuit of FIG. 3, three-bit thermometer code Tcu obtained from the comparator group for upper bits is converted to a signal (four bits) indicating the position of its change point by a decoder 3u. Three-bit thermometer code Tcd obtained from the comparator group for lower bits is also converted to a signal (four bits) indicating the position of its change point by a decoder 3d. In the conventional two-step parallel A/D converter, these decoder outputs are led to respective binary encoders. In the present embodiment, these decoder outputs are used as word selection signals of look-up tables, respectively. A filter circuit 4u for upper bits has look-up tables LUTu-1, LUTu-2 and LUTu-3. Word selection lines Wsu common to them are driven by outputs of the decoder 3u. A filter circuit 4d for lower bits has look-up tables LUTd-1, LUTd-2 and LUTd-3. Word selection lines Wsd common to them are driven by outputs of the decoder 3d. The circuit configuration and operation of each of the filter circuits 4u and 4d are identical to those of the filter circuit 4 of the embodiment shown in FIG. 1. In a weighting circuit 7, bit positions of an output FOu of the filter circuit 4u are shifted so that the output FOu may have four times the weight of output FOd of the filter circuit 4d. Results thus obtained are added in an adder $A_0$ to produce a desired filter output FILOUT.

A feature of the embodiment shown in FIG. 3 is that exactly the same data are stored in the look-up table group for upper bits and the look-up table for lower bits. In the same way as the circuit of FIG. 2, the circuit of this embodiment also includes a circuit for updating contents of the look-up tables. The updating circuit includes a table data generator 5 and a shift register 6. From the foregoing, the content updating circuit has such a configuration that the same data are written simultaneously into the look-up table for upper bits and the look-up table for lower bits. If the A/D conversion of the embodiment shown in FIG. 2 has precision of 6 bits, 64 cycles are needed to update the filter coefficients. On the other hand, if the A/D conversion of the embodiment shown in FIG. 3 has precision of 6 bits, only 8 cycles are needed to update the filter coefficients. Because the number of words of each table is 8, and the tables for upper bits and the tables for lower bits have the same contents.

Figure 4:
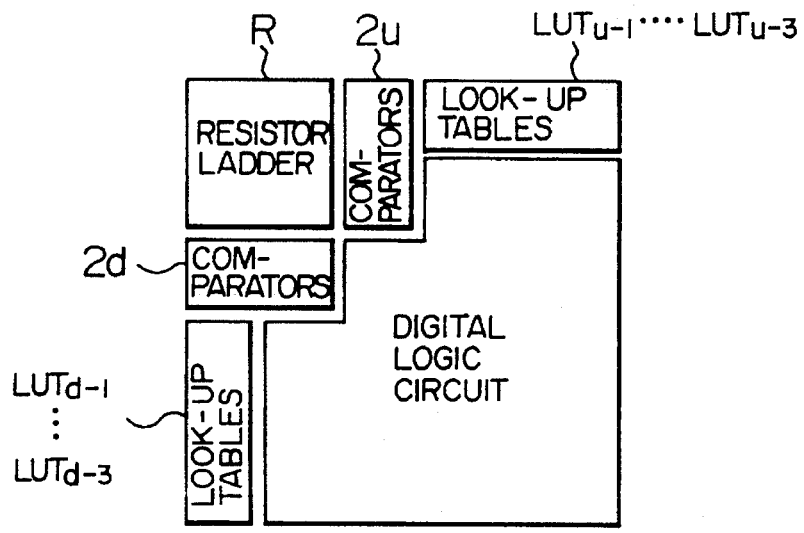
FIGS. 4, 5 and 6 are top views showing examples of an LSI layout of the third embodiment of the present invention.
Figure 5:
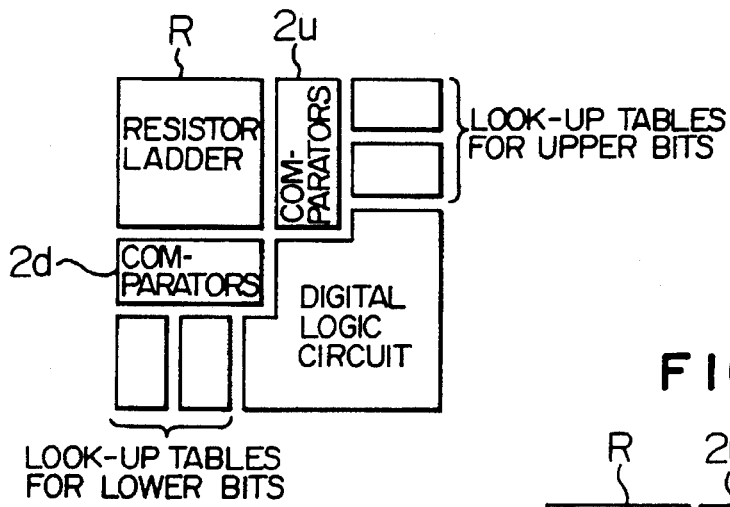
Figure 6:
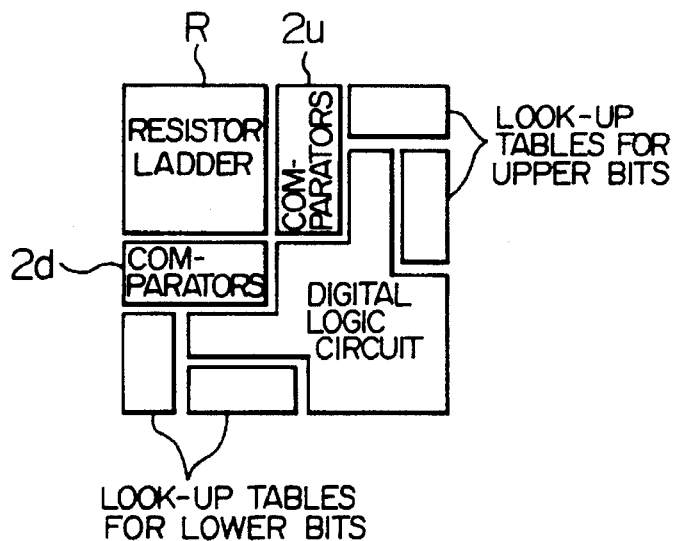

Examples of a layout on an LSI for implementing the embodiment of FIG. 3 are shown in FIGS. 4, 5 and 6. A resistor ladder R and comparator groups 2u and 2d, which are analog circuits, are disposed so as to adjoin each other. In order to efficiently dispose a large number of word selection signal lines Ws for the look-up tables output from the comparator groups, the comparator group 2u and the look-up tables for upper bits are disposed so as to adjoin each other and the comparator group 2d and the look-up tables for lower bits are disposed so as to adjoin each other. Depending upon the scale of the digital logic circuit, the configuration of FIG. 4, 5 or 6 can be selected.

Figure 7:
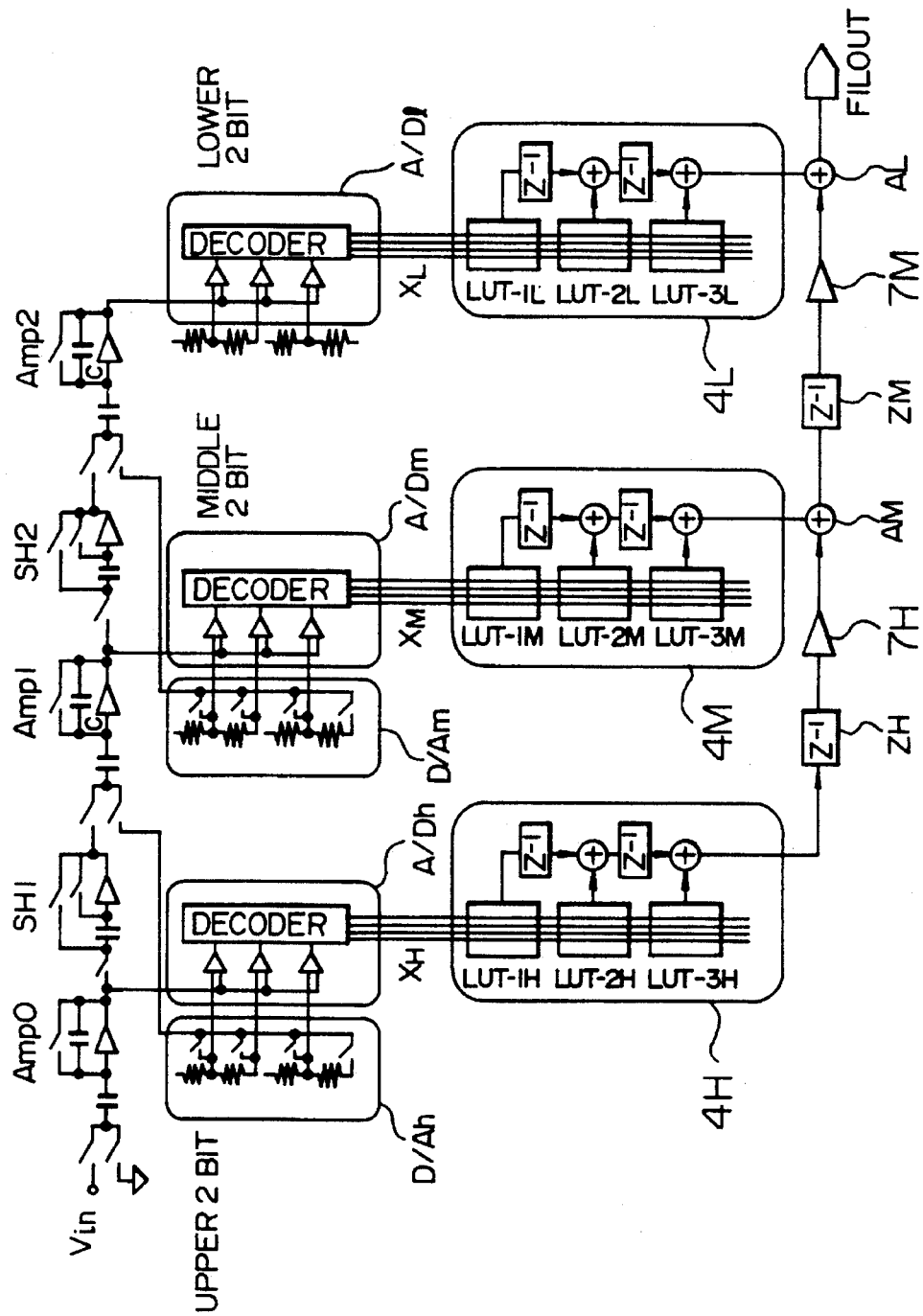
FIG. 7 is a block diagram showing a fourth embodiment of the present invention.

A fourth embodiment of the present invention is shown in FIG. 7. In FIG. 7, a three-tap digital filter circuit formed by combining a six-bit three-stage pipelined A/D converter with look-up tables is illustrated. The three-stage pipelined A/D converter itself is described in 1992, Symposium on VLSI Circuits, Digest of Technical Papers, pp. 98–99, for example. In the embodiment of FIG. 7, A/D conversion of two upper bits is carried out by an A/D converter A/Dh. In the same way as the embodiments heretofore described, a binary encoder is omitted in the A/D converter A/Dh. The final stage of A/Dh is a decoder (an exclusive OR gate group) for detecting a change point of the thermometer code. On the basis of the output of the A/Dh, a D/A converter D/Ah selects one voltage out of a group of reference voltages, i.e., restores the conversion output to an analog value. A chopper amplifier Amp1 derives the difference between the analog input signal Vin and the output of D/Ah and amplifies the difference to obtain a conversion error. The conversion error thus obtained is further subjected to A/D conversion in an A/D converter A/Dm, a conversion result of two middle bits being thus obtained. Furthermore, the conversion result of two middle bits is restored to an analog value by a D/A converter D/Am. A conversion error is obtained by a chopper amplifier Amp2. The conversion error thus obtained is further subjected to A/D conversion in an A/D converter A/Dl, a conversion result of two lower bits being thus obtained. The final stage of each of these A/D converters A/Dm and A/Dl is also a decoder (an exclusive OR gate group) for detecting a change point of the thermometer code. Filter circuits 4H, 4M and 4L, each including look-up tables, are provided for two upper bits, two middle bits and two lower bits, respectively. Each filter circuit has exactly the same configuration that the filter circuit of FIG. 1 has. For an input signal at the same time, the A/D converters A/Dh, A/Dm and A/Dl successively perform conversion by means of pipeline operation. The output of the filter circuit 4H is led to an adder AM via a delay unit ZH and added to the output of the filter circuit 4M. The result of this addition is led to an adder AL via a delay unit ZM and added to the output of the filter circuit 4L. At the time of each addition, weighting circuits 7H or 7M provides each data with a weight corresponding to each filter circuit.

Figure 8:
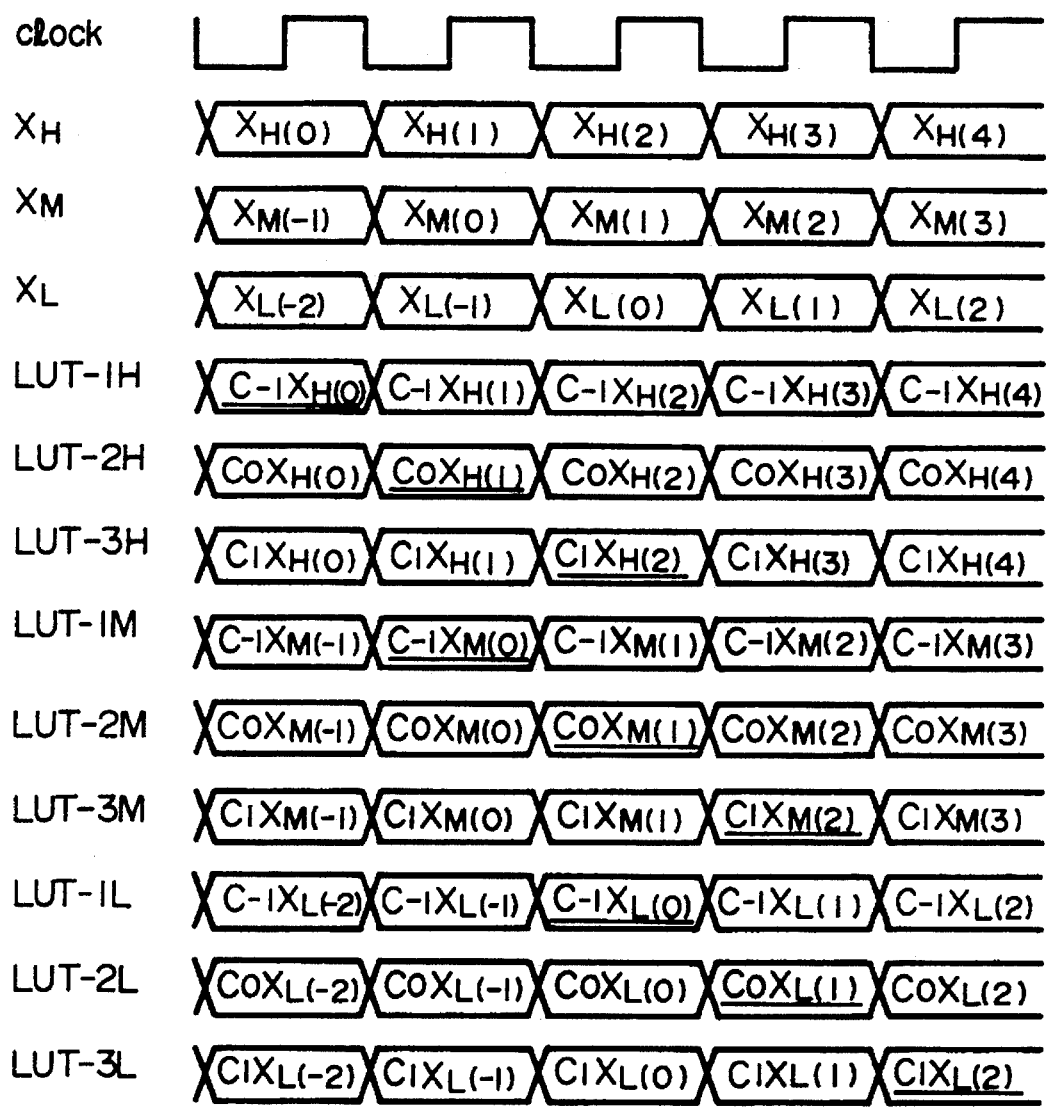
FIG. 8 is a time chart showing output timing of a fourth embodiment of the present invention.

Output timing of signals from respective look-up tables is shown in FIG. 8. In FIG. 8, $X_H$, $X_M$ and $X_L$ denote conversion outputs of the upper A/D converter A/Dh, the middle A/D converter A/Dm, and the lower A/D converter A/Dl, respectively. Numerals enclosed in parentheses denote sample numbers. Underlined data are data to be added for filtering. The embodiment shown in FIG. 7 uses a method of forming a filter every two bits of upper, middle and lower bits, weighting outputs of the filters, and adding up the weighted outputs. Since weighting is performed later, waste of the number of bits of adders is seldom caused. On the other hand, data which can be added together simultaneously may also be added in advance while they are being subjected to weighting in accordance with FIG. 8. In this case, delay for A/D conversion is actively used, and the delay circuits ZH and ZM can be omitted.

Figure 9:
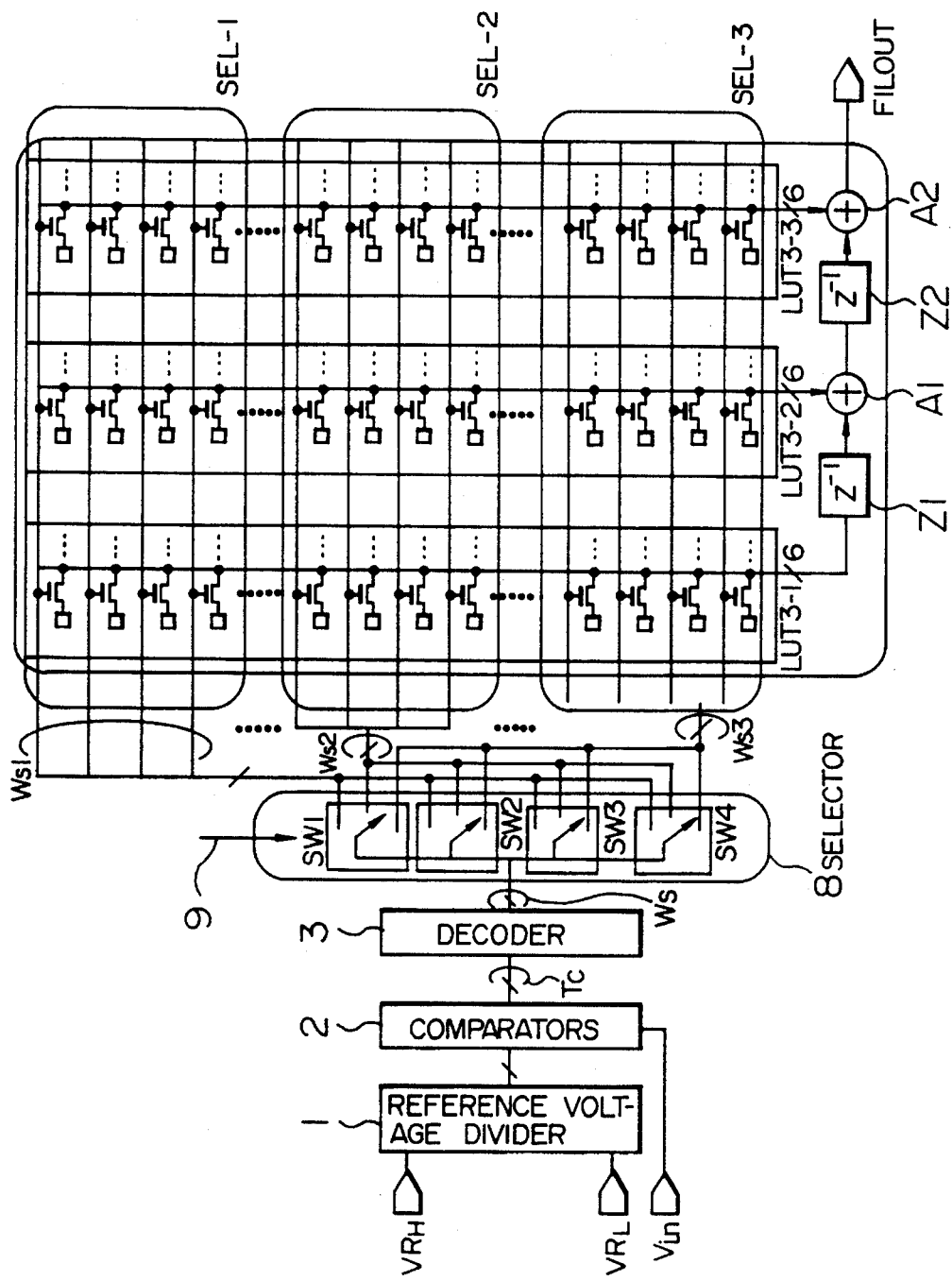
FIG. 9 is a block diagram showing a fifth embodiment of the present invention.

A fifth embodiment of the present invention is shown in FIG. 9. If the A/D conversion in the embodiment of FIG. 1 has precision of 2 bits, each of the look-up tables LUT-1, LUT-2, and LUT-3 has a capacity of 4 words. In the embodiment of FIG. 9, however, each of the look-up tables LUT3-1, LUT3-2 and LUT3-3 has a capacity of 12 words, which is three times as large as the capacity of the embodiment of FIG. 1. Every four word selection lines, however, the area of the look-up tables is divided into three parts: SEL-1, SEL-2 and SEL-3. For each part, data based upon different filter coefficients are stored. Among three sets of word selection lines, Ws1, Ws2 and Ws3, of such extended look-up tables, one set is selected by a selector circuit 8. Furthermore, one word selection line included in the selected set is driven by the output of a decoder 3. As for selection of a set of word selection lines in the selector circuit 8, the set is specified by a selection signal 9. In the embodiment of FIG. 9, adaptive filtering processing having filtering coefficients changed every moment at high speed can thus be realized by simple selector processing. Furthermore, in the present embodiment, contents of look-up tables which are not selected can be updated at any time. If look-up tables are provided for two sets of coefficients, therefore, one of the tables can be updated while filtering is being performed in the other of the tables. By using the tables alternately, application to an adaptive filter becomes possible.

Figure 10:
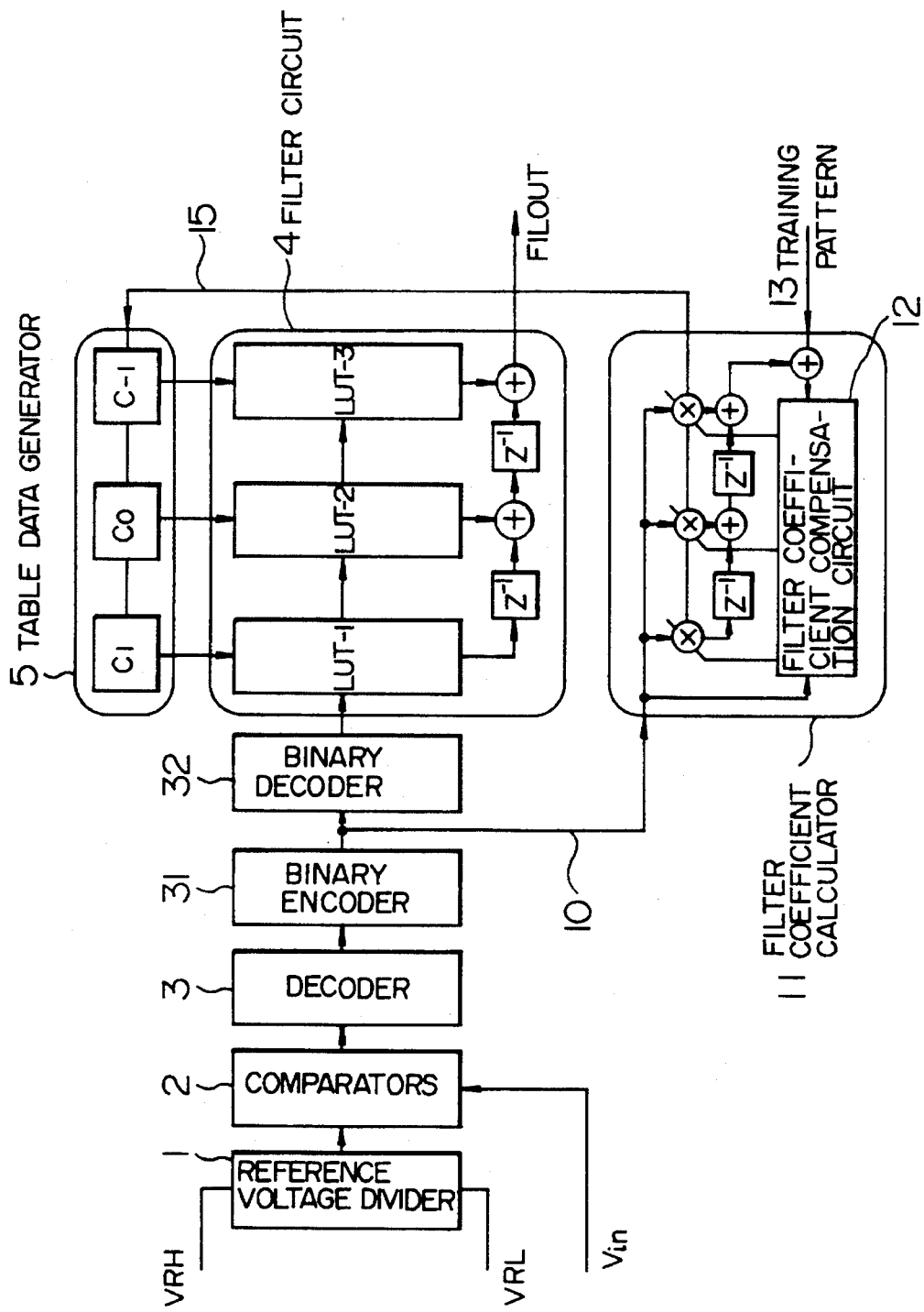
FIG. 10 is a block diagram showing a sixth embodiment of the present invention.

In ensuing embodiments, various programmable filters heretofore described are applied to adaptive equalizers. First of all, a sixth embodiment of the present invention will now be described by referring to FIG. 10.

For using a signal processing circuit (programmable filter) using an A/D converter and look-up tables as an adaptive equalizer capable of coping with a system which has an analog input signal changing in property with time, a circuit for automatically calculating filter coefficients is indispensable. Therefore, the circuit of FIG. 10 has a filter coefficient calculator 11. This filter coefficient calculator 11 itself has the configuration of the known adaptive equalizer which does not use look-up tables. As the input thereof, a digital value represented by a binary code is needed. The circuit of FIG. 10 has a binary encoder 31 for converting the output of the decoder 3, which detects the position of a change point of the thermometer code, to a binary code, and a binary decoder 32 for decoding the binary code to produce a word selection signal for the look-up tables LUT-1, LUT-2 and LUT-3. An analog signal generated so as to correspond to a pre-determined training pattern is input to the A/D converter. A digital signal 10 after encoding is successively input to the filter coefficient calculator 11. In the filter coefficient calculator 11, the filter coefficients are successively compensated by a filter coefficient compensation circuit 12 while the training pattern 13 is being compared with the filtered output. When the filter coefficients have been converged, values thereof are stored in registers of a table data generator 5. Thereby, values of words of the look-up tables LUT-1, LUT-2 and LUT-3 can be set according to the property of the analog input signal.

In equalizers, the filter coefficient $C_0$ of the center tap can be fixed at unity. If this property is used, an adaptive equalizer equivalent to that of FIG. 10 can be formed with the binary encoder 31 and the binary decoder 32 omitted. That is, binary code data itself having a value corresponding to each word line is written into each word of the look-up table LUT-2 shown in FIG. 10. As the digital signal 10 input to the filter coefficient calculator 11, a signal read out from the look-up table LUT-2 is used. As for word selection of the look-up tables LUT-1, LUT-2 and LUT-3, the output of the decoder 3 is used in the way as FIG. 2.

Figure 11:
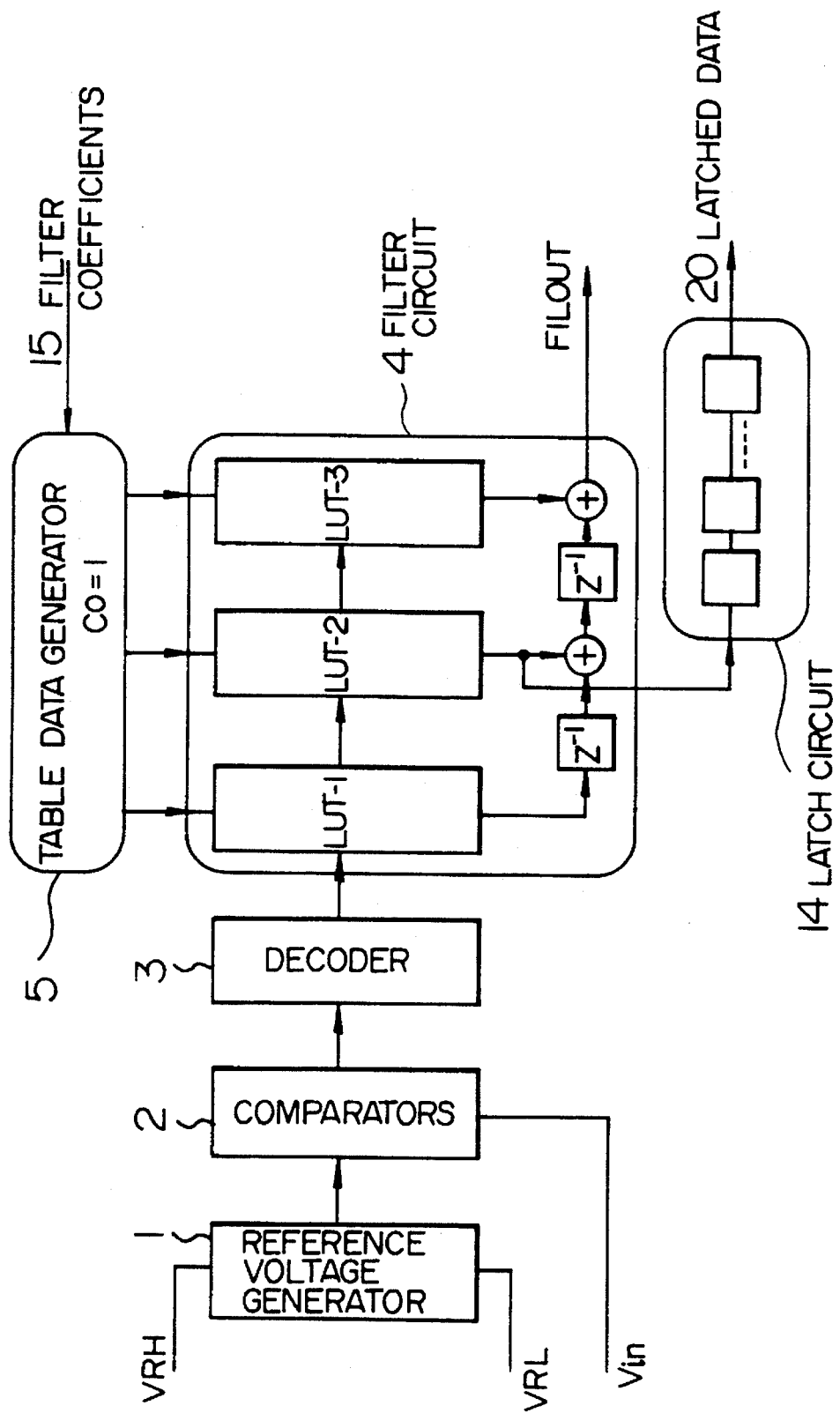
FIG. 11 is a block diagram showing a seventh embodiment of the present invention.

A seventh embodiment of the present invention is shown in FIG. 11.

In the present embodiment, the coefficient of the look-up table LUT-2 is set to unity, and the output of this look-up table LUT-2 is used as the output of the A/D converter. Furthermore, in the present embodiment, this output is input to a latch circuit 14 having a plurality of cascade-connected latch circuits and stored therein. The length of the latch circuit 14 must be at least the number of the look-up tables, wherein value of several hundred, at most is sufficient for the length.

In the present embodiment, the encoder can be removed from the A/D converter. By adding a simple latch circuit, a digital sample signal train of an input signal required for calculating coefficients can be obtained and used for other digital signal processing.

Figure 12:
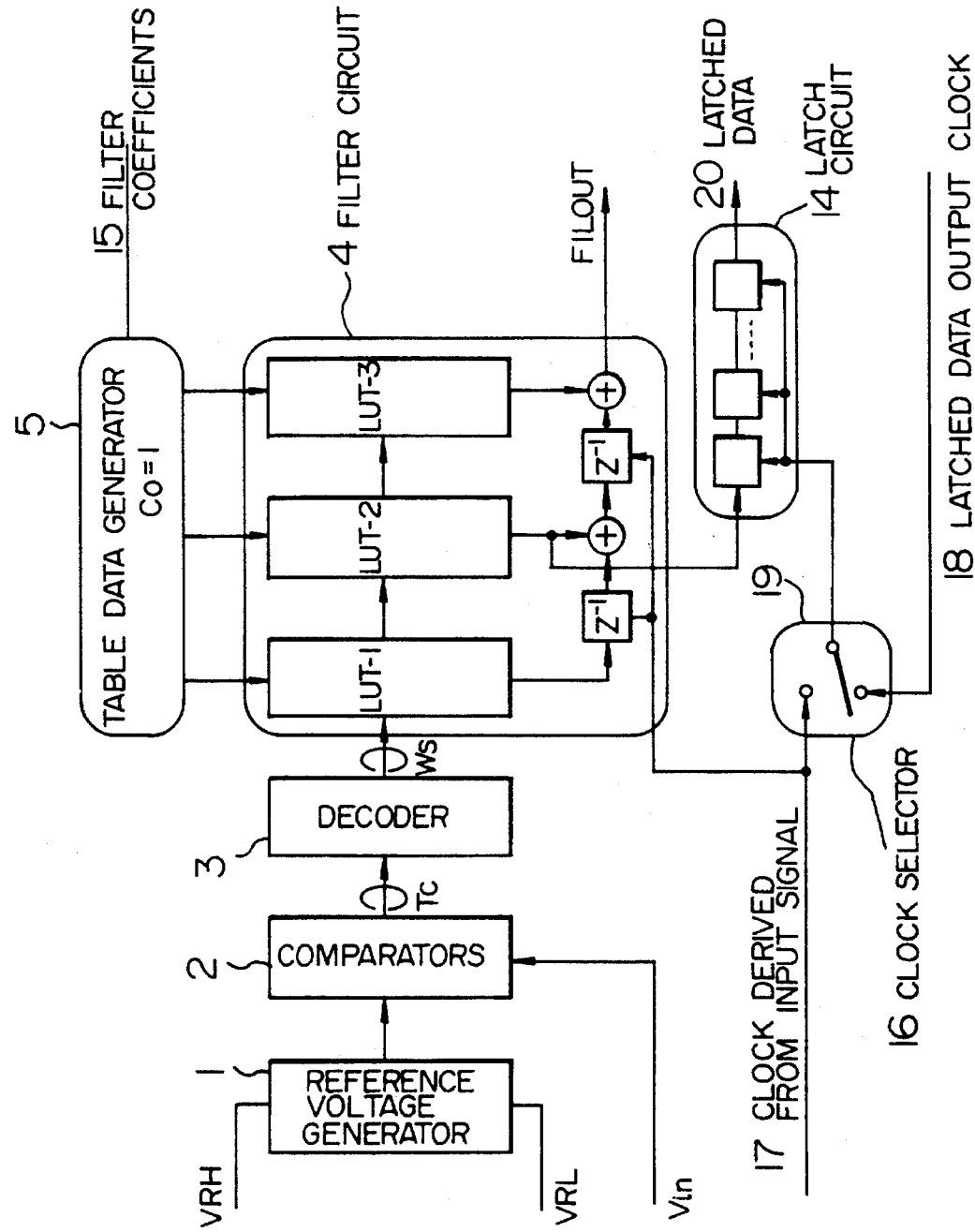
FIG. 12 is a block diagram showing an eighth embodiment of the present invention.

An eighth embodiment of the present invention is shown in FIG. 12.

In the present embodiment, a plurality of latch circuits are cascade-connected to the output of the look-up table LUT-2 having a coefficient set to unity to form the latch circuit 14. The present embodiment also has a clock selector 16 for changing over a drive clock 19 of this latch circuit 14 depending on whether a signal is to be input or output. In case a signal is to be input to the latch circuit 14, analog signals are recorded at data intervals by using a clock 17 derived from the input signal as the clock. In case a signal is to be taken out from the latch circuit, a clock 18 generated from an external filter coefficient calculator circuit, for example, is used as the clock. Furthermore, the input rate of the signal to this latch circuit 14 may be made equivalent to twice the data interval (i.e., equivalent to half of time interval).

In the present embodiment, filter coefficients can be calculated off-line. Therefore, complicated processing such as matrix computation becomes possible, and coefficients of high precision are obtained. Furthermore, if latching is performed at a rate which is twice the data interval, information required for calculating coefficients is obtained without strictly adjusting the clock phase.

Figure 13:
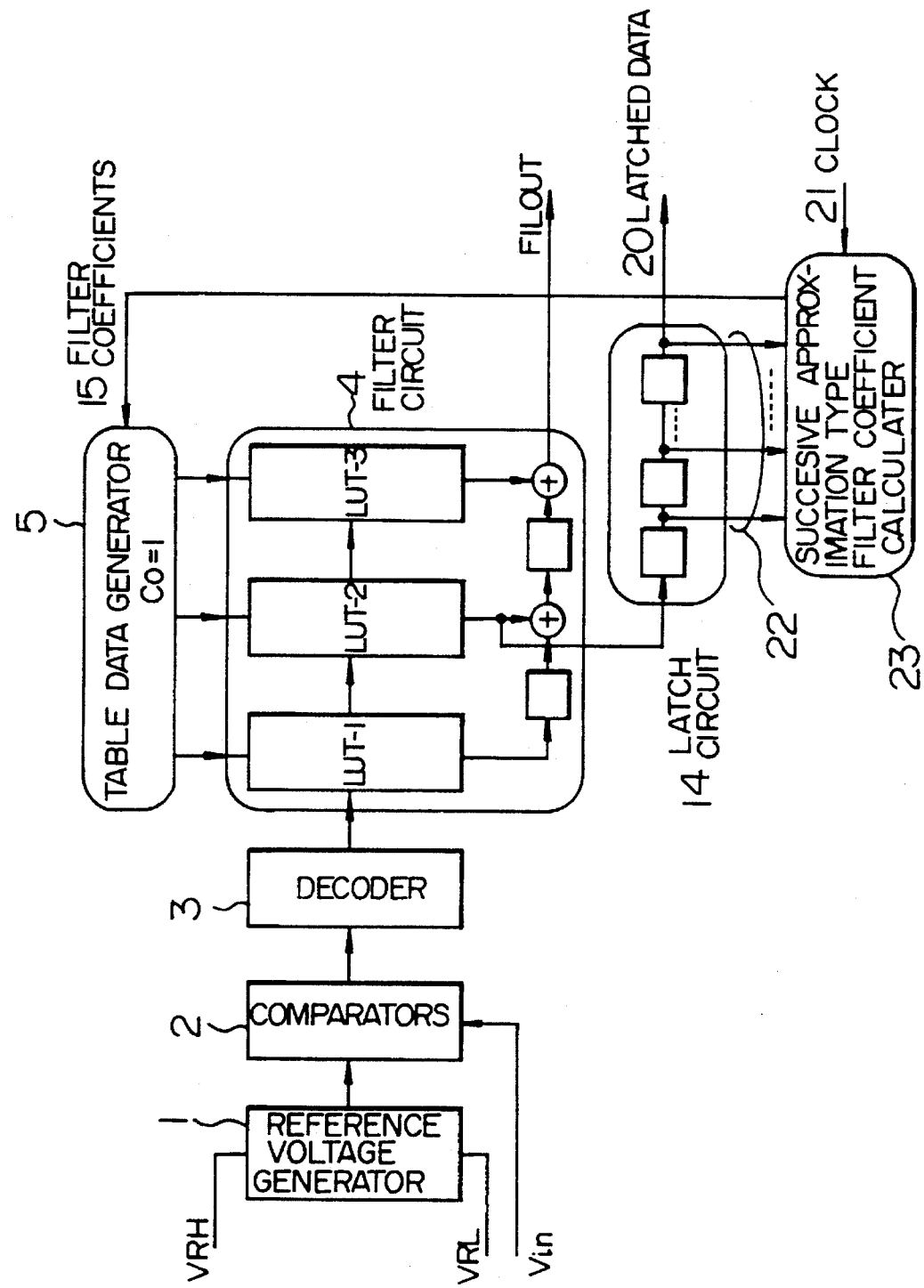
FIG. 13 is a block diagram showing a ninth embodiment of the present invention.

A ninth embodiment of the present invention is shown in FIG. 13.

In the present embodiment, successive approximation type algorithm is used in a circuit 23 for calculating on-line a plurality of filter coefficients described above, by using a signal value train 22 recorded in the latch circuit 14.

According to the present embodiment, the length of the latch circuit can be made equal to the number of look-up tables and external terminals for setting coefficients can be removed. As a result, a small-sized adaptive equalizer facilitating external control can be formed.

Figure 14:
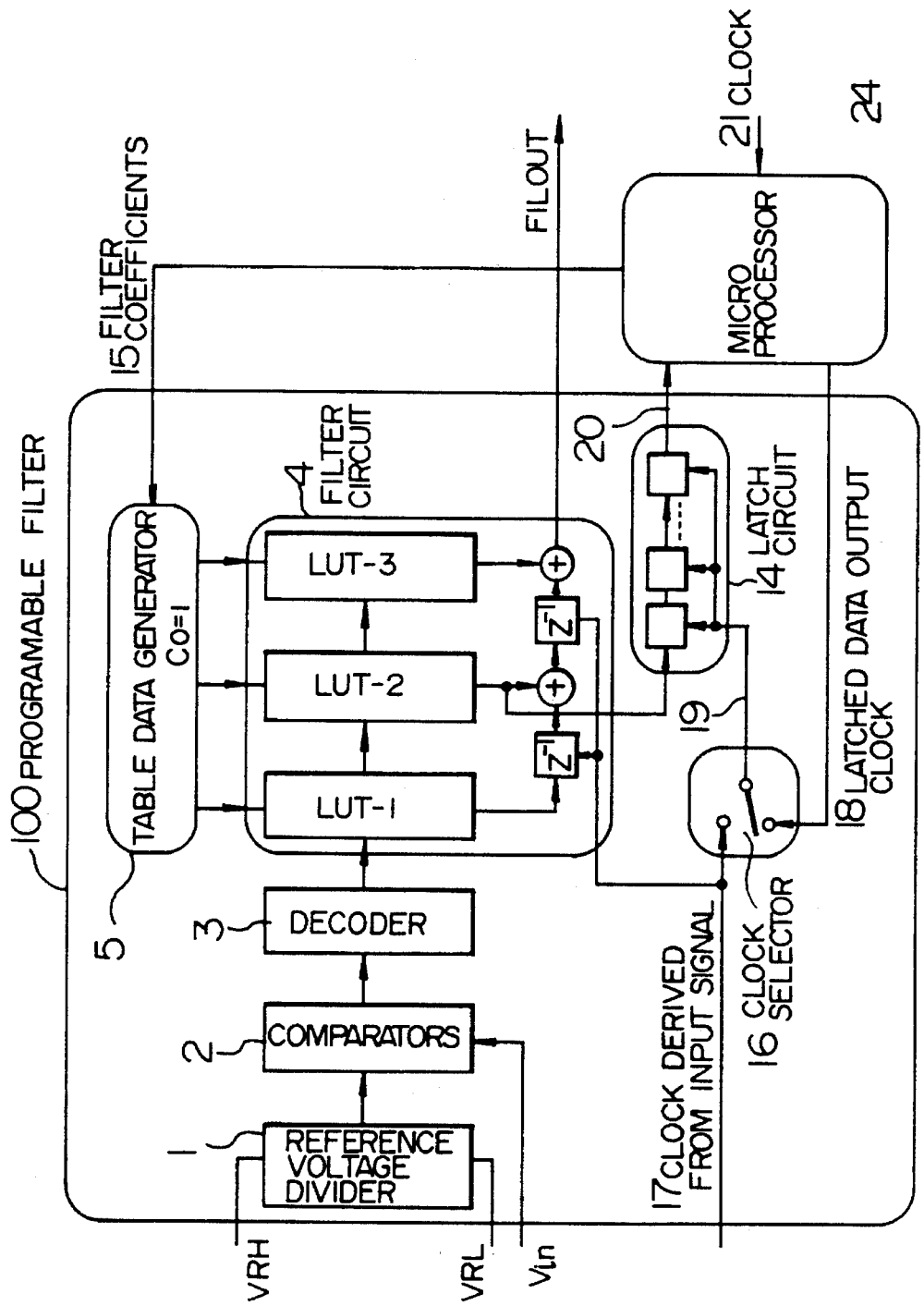
FIG. 14 is a block diagram showing a tenth embodiment of the present invention.

A tenth embodiment of the present invention is shown in FIG. 14.

In the same way as the seventh embodiment, the present embodiment has a clock selector 16 for changing over a drive clock 19 of the latch circuit 14 depending on whether a signal is to be input or output. Furthermore, by using a microprocessor 24 external to a programmable filter 100, a plurality of filter coefficients are calculated off-line. Furthermore, the input rate of the signal to this latch circuit 14 may be made equivalent to twice the data interval (i.e., equivalent to half of time interval).

In the present embodiment, a plurality of filter coefficients are calculated by using a microprocessor controlling an apparatus in which this adaptive equalizer is incorporated. Without increasing the circuit scale, therefore, coefficients can be calculated with high precision. Furthermore, if latching is performed at a rate which is twice the data interval, then information required for calculating coefficients is obtained without strictly adjusting the clock phase, and control of a clock generator circuit can be made simpler.

Figure 15:
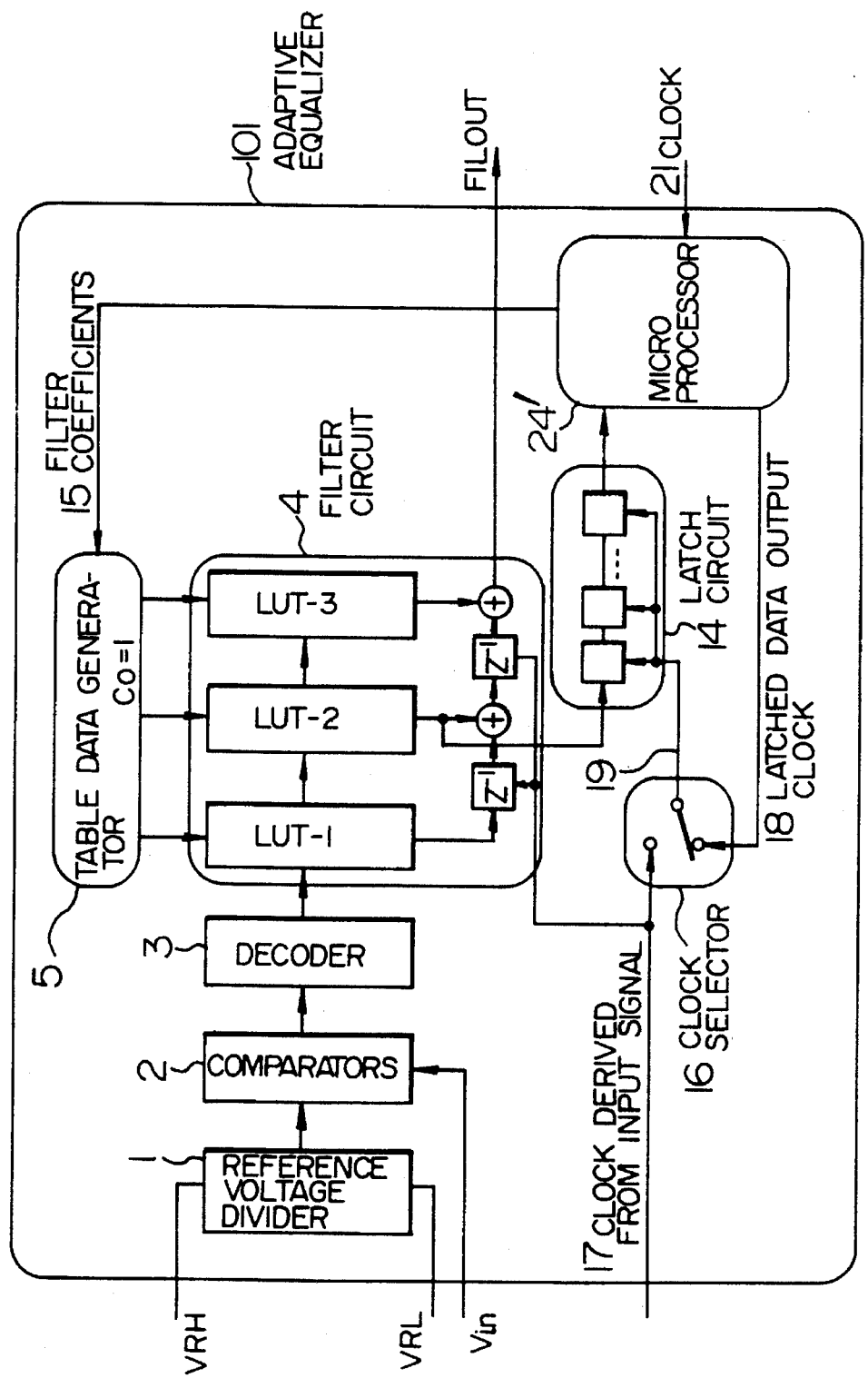
FIG. 15 is a block diagram showing an eleventh embodiment of the present invention.

An eleventh embodiment of the present invention is shown in FIG. 15.

In the present embodiment, an adaptive equalizer 101 is formed by disposing a microprocessor 24' inside the equalizer 101 instead of the external microprocessor 24 of the tenth embodiment. In this microprocessor 24', signal values of the above described latch circuit 14 are processed at time intervals different from those at the time of recording. A plurality of filter coefficients described above are thus calculated.

In the present embodiment, a special purpose microprocessor is used for calculating filter coefficients, and hence the time for calculating coefficients can be reduced.

Figure 16:
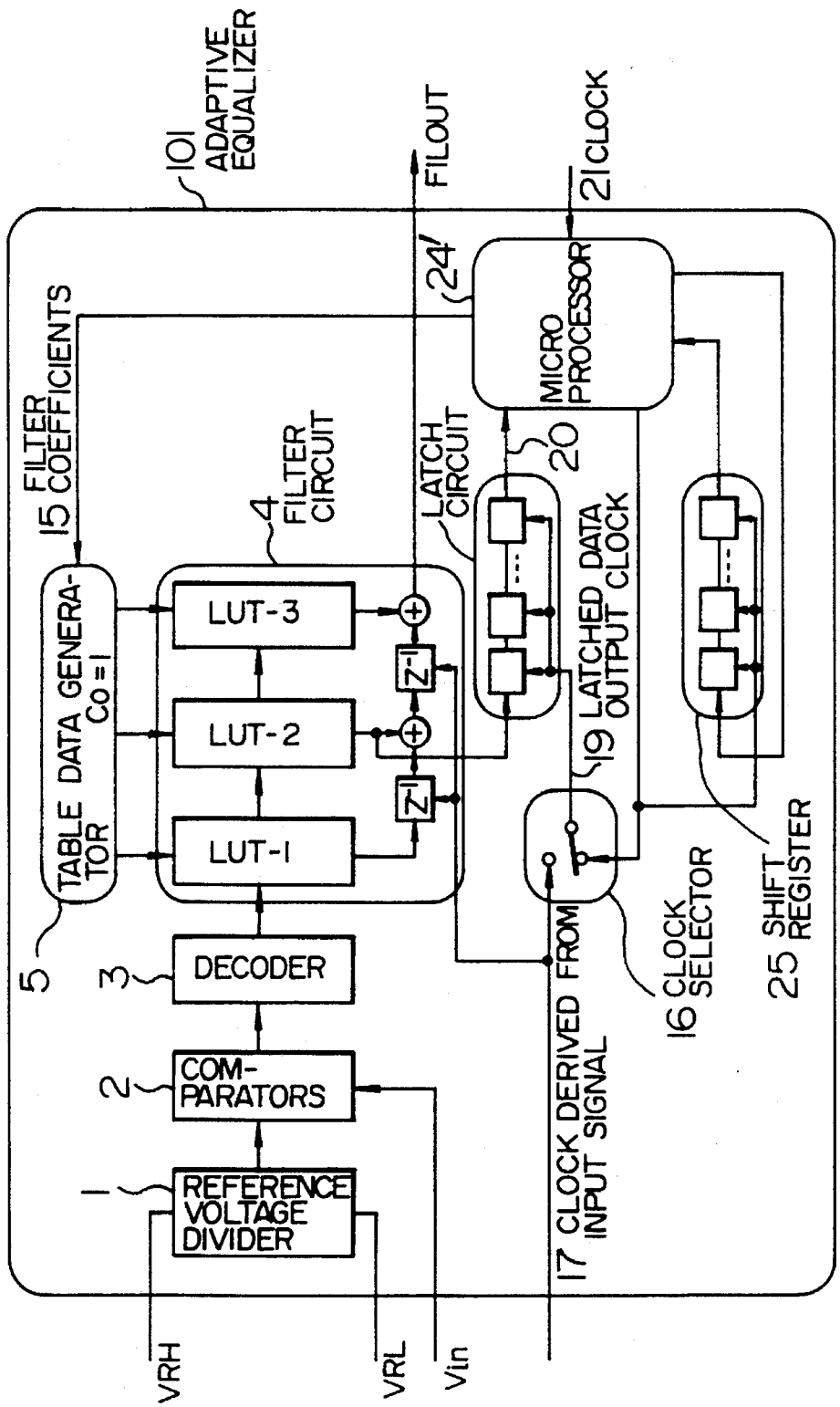
FIG. 16 is a block diagram showing a twelfth embodiment of the present invention.

A twelfth embodiment of the present invention is shown in FIG. 16.

In the present embodiment, a circuit for recording a target value of equalization for calculating coefficients into a memory such as a shift register 25 is added to the tenth embodiment.

The present embodiment facilitates training using pattern data.

Figure 17:
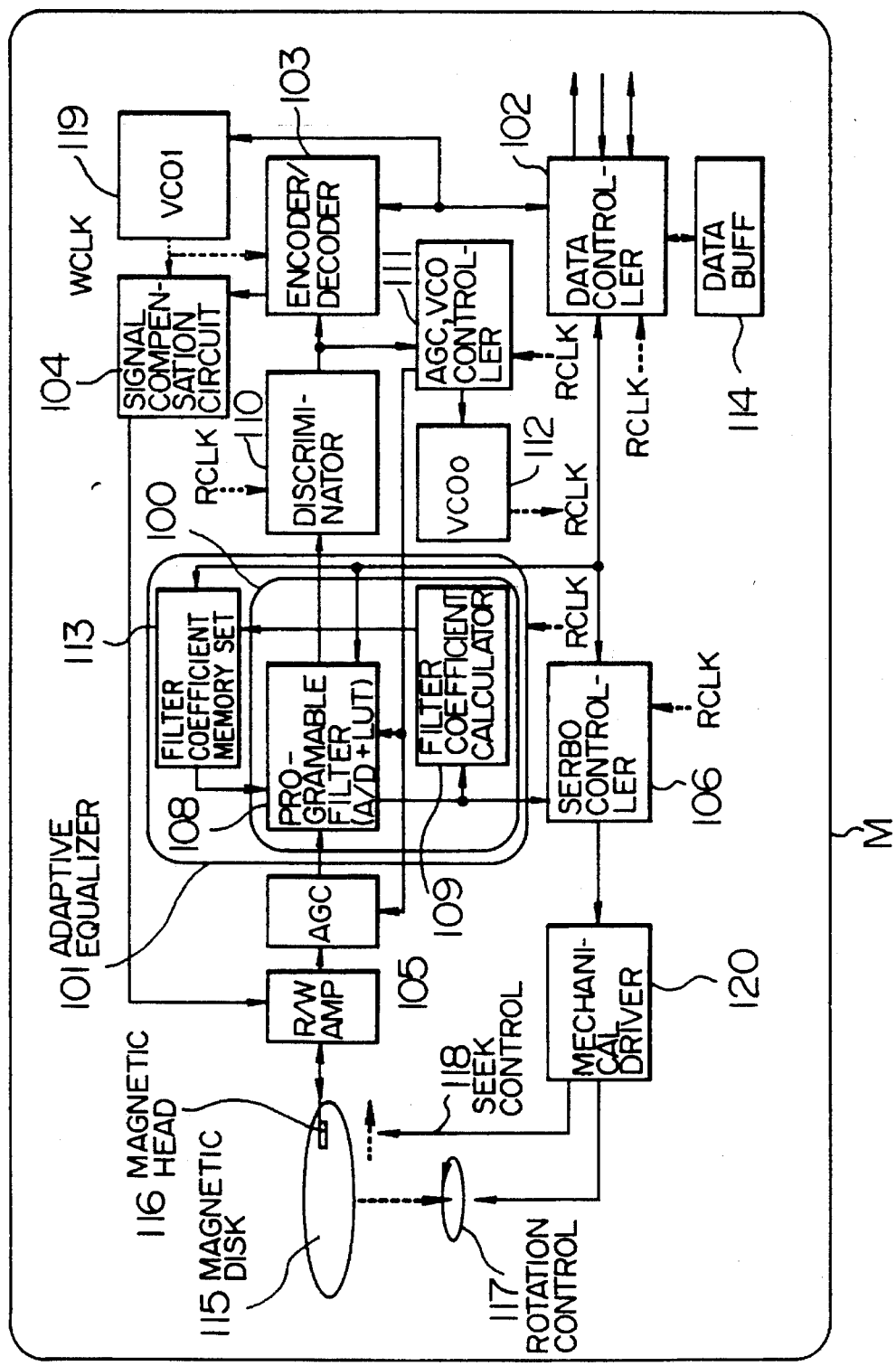
FIG. 17 is a block diagram showing a thirteenth embodiment of the present invention.

A thirteenth embodiment of the present invention is shown in FIG. 17. In the present embodiment, an adaptive equalizer according to the present invention is applied to a magnetic disk apparatus.

The configuration of a magnetic disk apparatus whereto the present invention has been applied is shown in FIG. 17. A magnetic disk apparatus M includes a controller 102 for exercising various controls, an encoder/decoder 103 for generating data to be recorded and converting reproduced magnetization information to user data, a signal compensation circuit 104 for controlling the inversion position of the recording current on the basis of a recording data train, a recording current driver and preamplifier 105, a servo controller 106 for controlling seek operation of a head and rotation of a magnetic disk, and a reproduction circuit system 107 to 113 for reproducing magnetic field information on the magnetic disk. The reproducing system relating to the adaptive equalizer 101 will now be described.

Operation at the time of reproduction will now be described in brief by referring to FIG. 17. Magnetization information recorded on a magnetic disk 115 is detected by a head 116 as an electric signal. The signal is amplified by the preamplifier of the recording/reproducing amplifier (R/W Amp) 105, and subjected to amplitude adjustment in an AGC circuit 107 so that an output amplitude suitable for discrimination may be obtained. A resultant signal is input to the adaptive equalizer 101. The adaptive equalizer 101 includes a programmable filter 108, a filter coefficient calculator 109 for calculating filter coefficients of the programmable filter 108, and a memory set 113 for storing calculated filter coefficients. The programmable filter 108 includes an A/D converter, a plurality of look-up tables, and a table data generator. As the programmable filter 108, the filter of the embodiment shown in FIGS. 2, 3, 7, 10 or 11 can be used. As the filter coefficient calculator 109, the successive approximation type coefficient calculator 23 of FIG. 13, the microprocessor 24 of FIG. 14, or the built-in microprocessor 24' of FIG. 15 can be used. Furthermore, a different filter coefficient calculator 11 shown in FIG. 10 may also be used as the filter coefficient calculator 109. Table data are set in look-up tables of the filter 108 so as to correspond to the seek operation of the head 116. For each seek operation, the filter coefficient calculator 109 is activated so that optimum equalization may be conducted at all times. Furthermore, the output of the filter 108 is sent to a discriminator 110, converted to user data in the decoder 103, and subjected to error correction in the controller 102.

If the filter coefficient calculator 109 is activated to calculate coefficients for each of annular zones sharing the recording area of the magnetic disk 115 along the radial direction only at the time of shipping or power turning on and the filter coefficients are stored in the memory set 113, then coefficients of the look-up tables can be set from the coefficient memory set 113 at the time of reproduction operation on the basis of information (track position) of seek destination supplied from the controller 102. In this case, the training area in each of the annular zones on the magnetic disk 115 used to calculate coefficients can be erased when coefficients have been calculated and this area can be used as a user data area. Furthermore, the filter coefficient calculator 109 needs only to operate at the time of shipping or power turning on and it does not operate in the normal reproduction state. Therefore, power consumption of this part can be reduced. Furthermore, although it is a matter of course that a low-pass filter is disposed before the A/D converter, a booster circuit for enhancing a high-frequency component in the signal band may also be included in order to increase the number of effective bits.

According to the present invention, many parts of the reproduction system can be digitized and multipliers which were obstacles to higher speed and lower power consumption can be removed. Therefore, a high-speed, low power consumption, small-sized magnetic disk apparatus can be easily realized.

In the present embodiment, the case where an adaptive equalizer is used in the reproduction system of the magnetic disk apparatus has been described. However, it is evident that the adaptive equalizer can be applied in the same way to reproduction systems of a floppy disk apparatus, a magnetic tape apparatus, an optical apparatus, and an optical magnetic disk apparatus.

In all embodiments heretofore described, each of the number of bits of the A/D converter and the number of taps of the filter has been limited to a small number for brevity of description. However, a similar configuration is possible even if the number of bits and the number of taps are increased or decreased. As for the embodiment relating to the adaptive equalizer and the embodiment in the magnetic disk apparatus, it is evident that a so-called decision feedback type equalizer can be formed by disposing a simple discriminator and a random access memory at the output of the equalizer.

We claim:

1. A signal processing apparatus for converting an inputted analog signal to a digital signal and deriving sum of products, comprising:

a circuit for comparing said inputted analog signal with each voltage of a group of analog reference voltages and generating a thermometer code depending upon said inputted analog signal;

a plurality of memory circuits having, as word selection lines, signal lines indicating a change point of said thermometer code; and means, including a plurality of arithmetic elements, for inputting output signals from the plurality of memory circuits into the plurality of arithmetic elements, respectively, to execute filter arithmetic processing.

2. A signal processing apparatus for converting an inputted analog signal to a digital signal and deriving sum of products, comprising:

a circuit for comparing said inputted analog signal with each voltage of a group of analog reference voltages and generating a thermometer code depending upon said inputted analog signal;

a plurality of memory circuits having, as word selection lines, signal lines indicating a change point of said thermometer code; and delay circuits and adder circuits for providing signals read out from said plurality of memory circuits with predetermined delays and adding up the delayed signals.

3. A signal processing apparatus for converting an inputted analog signal to a digital signal and deriving sum of products, comprising:

a circuit for comparing said inputted analog signal with each voltage of a group of analog reference voltages and generating a thermometer code depending upon said inputted analog signal;

a plurality of memory circuits having, as word selection lines, signal lines indicating a change point of said thermometer code; and a circuit for calculating data to be stored in said plurality of memory circuits.

4. A signal processing apparatus according to claim 3, wherein the circuit for calculating data to be stored in said plurality of memory circuits comprises an accumulator circuit.

5. A signal processing apparatus for converting an inputted analog signal to a digital signal and deriving sum of products, comprising a circuit for comparing said inputted analog signal with each voltage of a group of analog reference voltages and generating a thermometer code depending upon said input analog signal;

a plurality of memory circuits having, as word selection lines, signal lines indicating a change point of said thermometer code, wherein the number of words of said memory circuits is larger than the number of the signal lines indicating a change point of the thermometer code; and said signal processing apparatus further comprises:

a selector circuit for connecting one of a plurality of word selection lines to one of the signal lines indicating a change points of said thermometer code.

6. A signal processing apparatus for converting an inputted analog signal to a digital signal and deriving sum of products, comprising a circuit for comparing said inputted analog signal with each voltage of a group of analog reference voltages and generating a thermometer code depending upon said inputted analog signal; and a plurality of memory circuits having, as word selection lines, signal lines indicating a change point of said thermometer code, wherein a product of an input signal value corresponding to each word selection line and a predetermined coefficient is stored in the corresponding word of said memory circuits, and said coefficient of at least one of said memory circuits is decided to be unity.

7. A signal processing apparatus according to claim 6, further comprising a latch circuit connected to a signal output of said memory circuit having the coefficient of unity, the output signal value of the memory circuit having the coefficient of unity being recorded at intervals of a sample period of the analog signal.

8. A signal processing apparatus according to claim 7, wherein said latch circuit records the output signal value of said memory circuit having the coefficient of unity at intervals of half a sample period of the analog signal.

9. A signal processing apparatus according to claim 7, further comprising means for calculating coefficients of said plurality of memory circuits by using the signal value recorded in said latch circuit.

10. A signal processing apparatus according to claim 7, further comprising means for outputting the signal value of said latch circuit at time intervals different from those at the time of recording.

11. A signal processing apparatus according to claim 7, further comprising means for processing the signal value of said latch circuit at time intervals different from those at the time of recording and calculating coefficients of said plurality of memory circuits.

12. A signal processing apparatus according to claim 7, further comprising a memory for storing a target value of signal processing.

13. A magnetic recording and reproducing apparatus including a recording medium, a reproducing head for detecting, as an electric signal, magnetization information recorded on said recording medium, a preamplifier for amplifying the electric signal of said reproducing head, an AGC circuit for controlling an amplitude of an output signal of said preamplifier, an equalizer for equalizing an output signal of said AGC circuit, and a discriminator for receiving an output of said equalizer and discriminating the magnetization information, said equalizer comprising:

a circuit for comparing an inputted analog signal output from said AGC circuit with applied analog reference voltage and generating a thermometer code depending upon said analog signal;

a circuit for detecting a change point of said thermometer code;

a plurality of memory circuits having, as word selection lines, signal lines indicating a change point of said thermometer code; and delay circuits and adder circuits for providing signals read out from said plurality of memory circuits with predetermined delays and adding up the delayed signals.

14. A signal process circuit comprising:

converter means having an analog input signal as its input and outputting a signal to specific one of a plurality of parallel signal lines depending upon the magnitude of said analog signal;

wherein said converter means comprises:
comparison means responsive to an analog input signal to output as many "high" signal as be proportionate to a magnitude of the analog input signal, a plurality of transmission lines for transmitting said "high" signals and predetermined "low" signals in parallel, and a plurality of computation means for performing exclusive OR function on adjacent outputs of said plurality of transmission lines, outputs of said plurality of computation means being inputted to said plurality of signal lines; and a plurality of look-up tables having said plurality of signal lines as input thereof.

15. A signal processing circuit according to claim 14, wherein each of said look-up tables stores products of outputs of said computation means and a predetermined coefficient.

16. A signal processing circuit according to claim 15, wherein said look-up tables comprise:
- a first table for storing products of outputs of said computation means and a first coefficient;
- a second table for storing products of the outputs of said computation means and a second coefficient; and
- a third table for storing products of the outputs of said computation means and a third coefficient, and said signal processing circuit further comprises adder means for adding an output of said first table provided with a first amount of delays, an output of said second table provided with a second amount of delays, and an output of said third table.

17. A signal processing circuit comprising:
- a ladder resistor group for outputting different reference voltages in parallel;
- a comparator group for comparing input voltage with said reference voltages and outputting results of magnitude comparison in parallel;
- a decoder for performing computation on respective adjacent outputs of parallel outputs of said comparator group and outputting results in parallel;
- look-up tables having parallel outputs of said decoder as inputs; and
- means, including a plurality of arithmetic elements, for inputting output signals from the plurality of memory circuits (look-up tables) into the plurality of arithmetic elements, respectively, to execute filter arithmetic processing.

18. A signal processing circuit comprising:
- a ladder resistor group for outputting different reference voltages in parallel;
- a comparator group for comparing input voltage with said reference voltages and outputting results of magnitude comparison in parallel;
- a decoder for performing computation on respective adjacent outputs of parallel outputs of said comparator group and outputting results in parallel; and
- look-up tables having parallel outputs of said decoder as inputs,
- wherein each of said comparator group, decoder and look-up tables has a configuration bisected into an upper part and a lower part.

19. A signal processing circuit according to claim 18, wherein said signal processing circuit has a block configuration having bilateral symmetry, and an upper comparison block having said upper comparator group and upper decoder and a lower comparison block having said lower comparator group and lower decoder are symmetrically disposed on the left side and on the right side of said ladder resistor group.

* * * * *